(12) United States Patent
Huang et al.

(10) Patent No.: US 7,338,140 B1
(45) Date of Patent: Mar. 4, 2008

(54) COMPUTER HOUSING

(75) Inventors: Yuh-Wen Huang, Tainan (TW);
I-Ching Chou, Tainan Hsien (TW);
Chun-Liang Li, Tainan Hsien (TW);
Chih-Wei Lin, Tainan Hsien (TW)

(73) Assignee: Compucase Enterprise Co., Ltd., Tainan (TW)

( * ) Notice: Subject to any disclaimer, the term of this patent is extended or adjusted under 35 U.S.C. 154(b) by 0 days.

(21) Appl. No.: 11/676,295

(22) Filed: Feb. 18, 2007

(51) Int. Cl.
*A47B 97/00* (2006.01)

(52) U.S. Cl. .................................. 312/223.2

(58) Field of Classification Search ............. 312/223.1, 312/223.2, 257.1, 265.5, 265.6; 361/685, 361/687, 724, 727
See application file for complete search history.

(56) References Cited

U.S. PATENT DOCUMENTS 5,199,776 A * 4/1993 Lin .......................... 312/293.3
5,542,757 A * 8/1996 Chang ...................... 312/223.2
5,547,272 A * 8/1996 Paterson et al. .......... 312/223.2
5,884,988 A * 3/1999 Foo et al. ................. 312/223.2
6,125,031 A * 9/2000 Della Fiora et al. ......... 361/683

\* cited by examiner

*Primary Examiner*—James O. Hansen
(74) *Attorney, Agent, or Firm*—Brooks Kushman P.C.

(57) ABSTRACT

A computer housing includes: a housing body having a front wall formed with a front opening and a mounting frame that defines a frame space and that has two opposite side walls, each of which is formed with two engaging holes and an engaging notch; and a faceplate having two engaging units, each of which includes a pair of first engaging arms and a second engaging arm. Each of the first engaging arms extends into a respective one of the engaging holes. The second engaging arm has a hook end in snap engagement with the engaging notch.

2 Claims, 8 Drawing Sheets

COMPUTER HOUSING

BACKGROUND OF THE INVENTION

1. Field of the Invention

The invention relates to a computer housing, more particularly to a computer housing formed with a front opening covered by a faceplate that has a width substantially equal to that of the front opening.

2. Description of the Related Art

Figure 1:
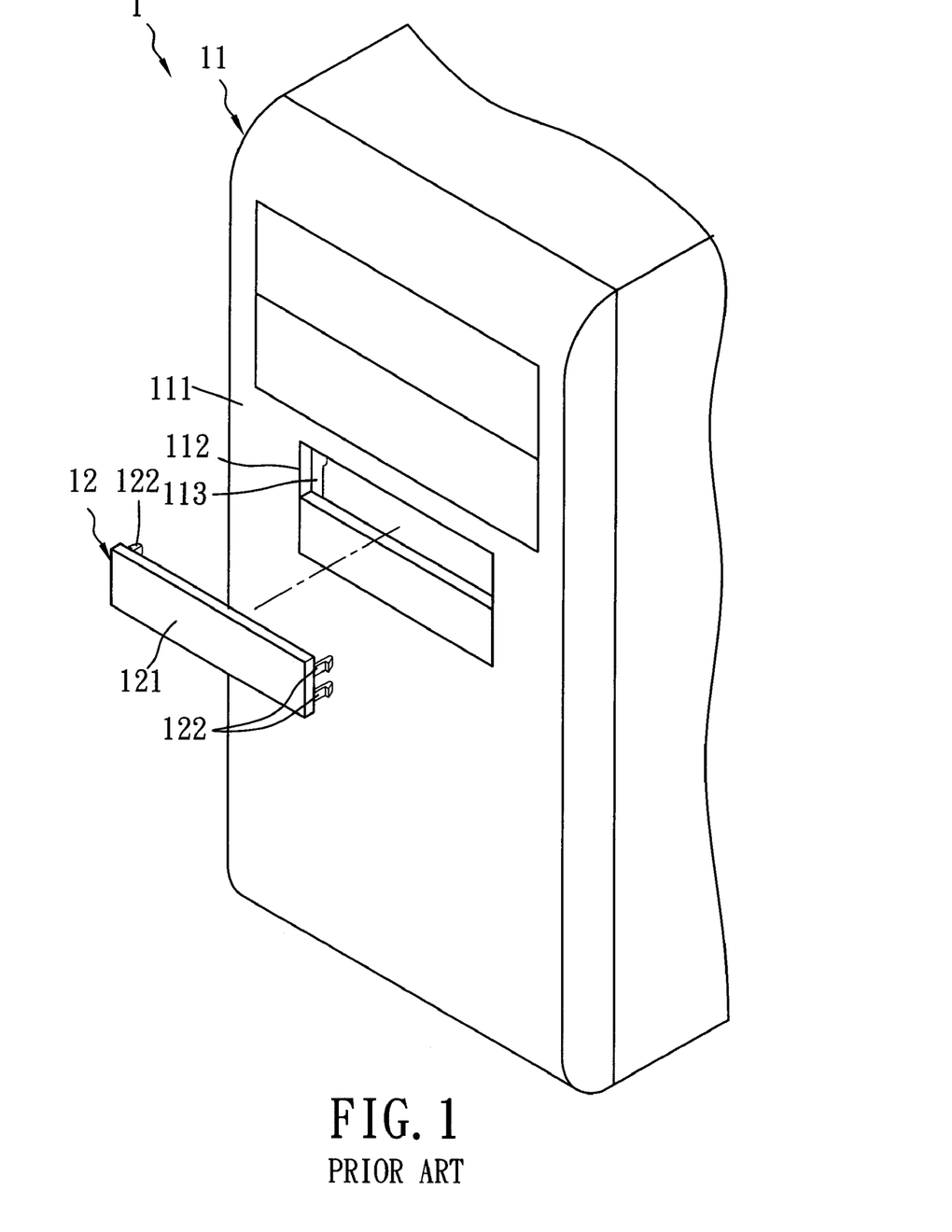
FIG. 1 is a fragmentary, partly exploded perspective view of a conventional computer housing having a faceplate detached therefrom.
Figure 2:
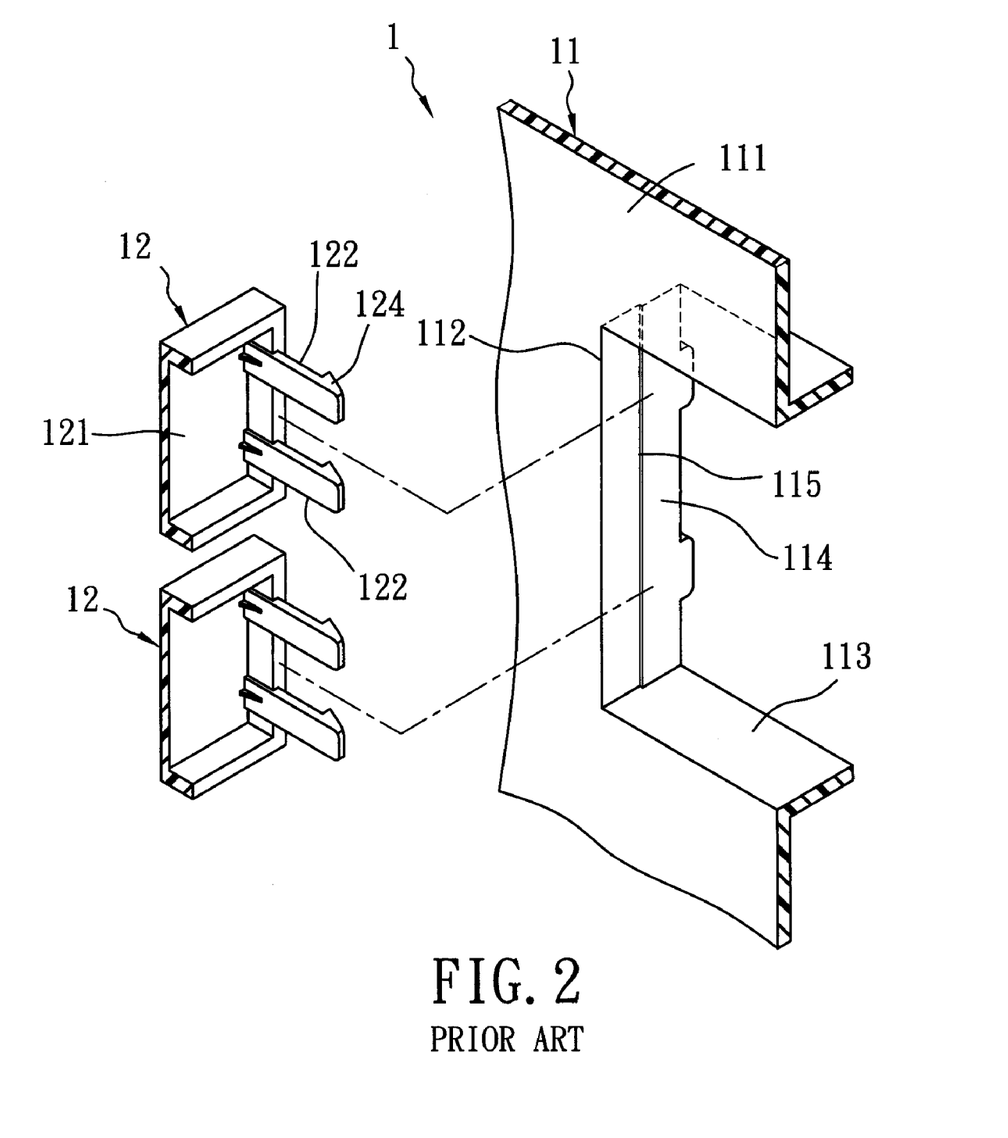
FIG. 2 is a fragmentary, partly sectional, perspective view of the conventional computer housing.
Figure 3:
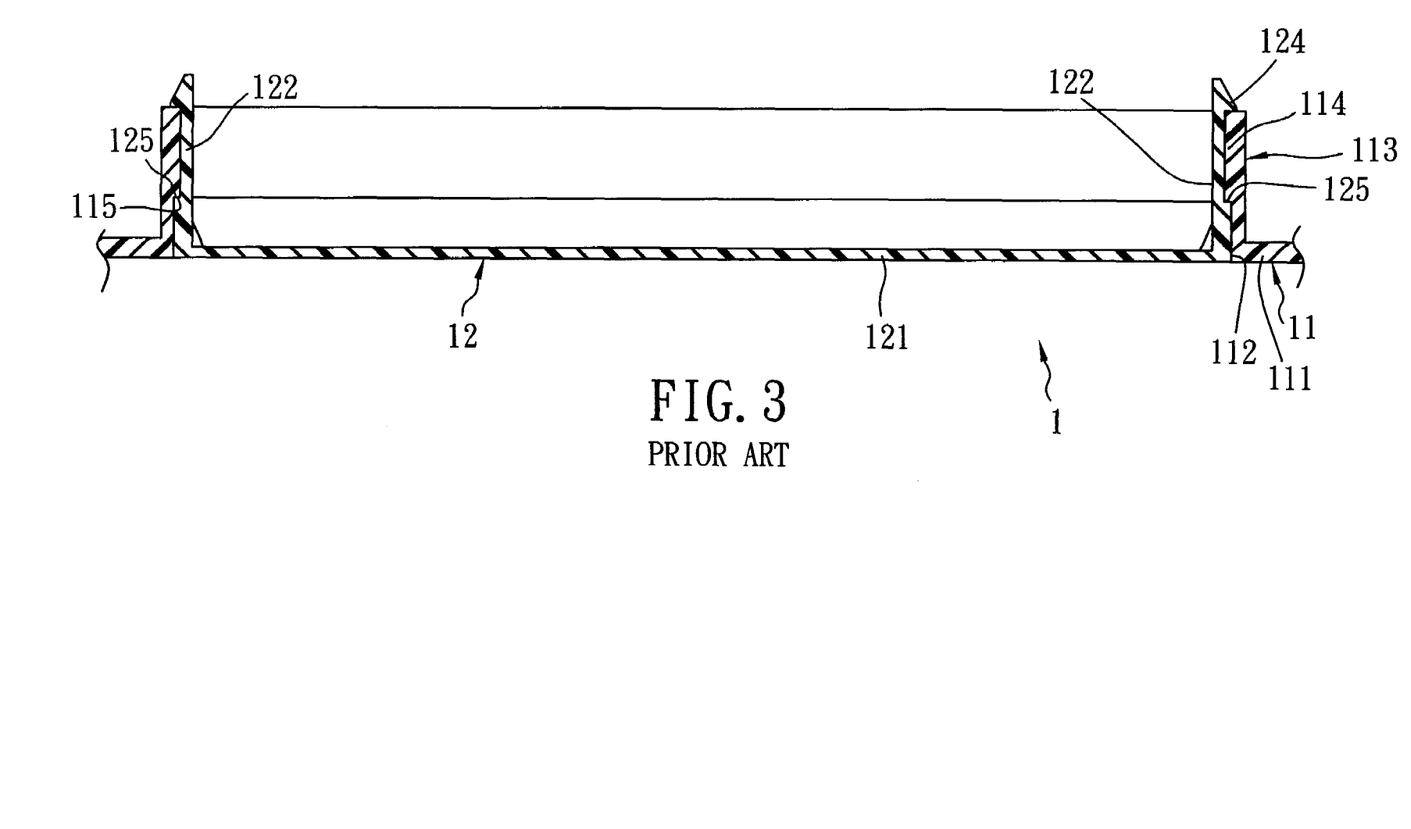
FIG. 3 is a sectional top view of the conventional computer housing.
Figure 4:
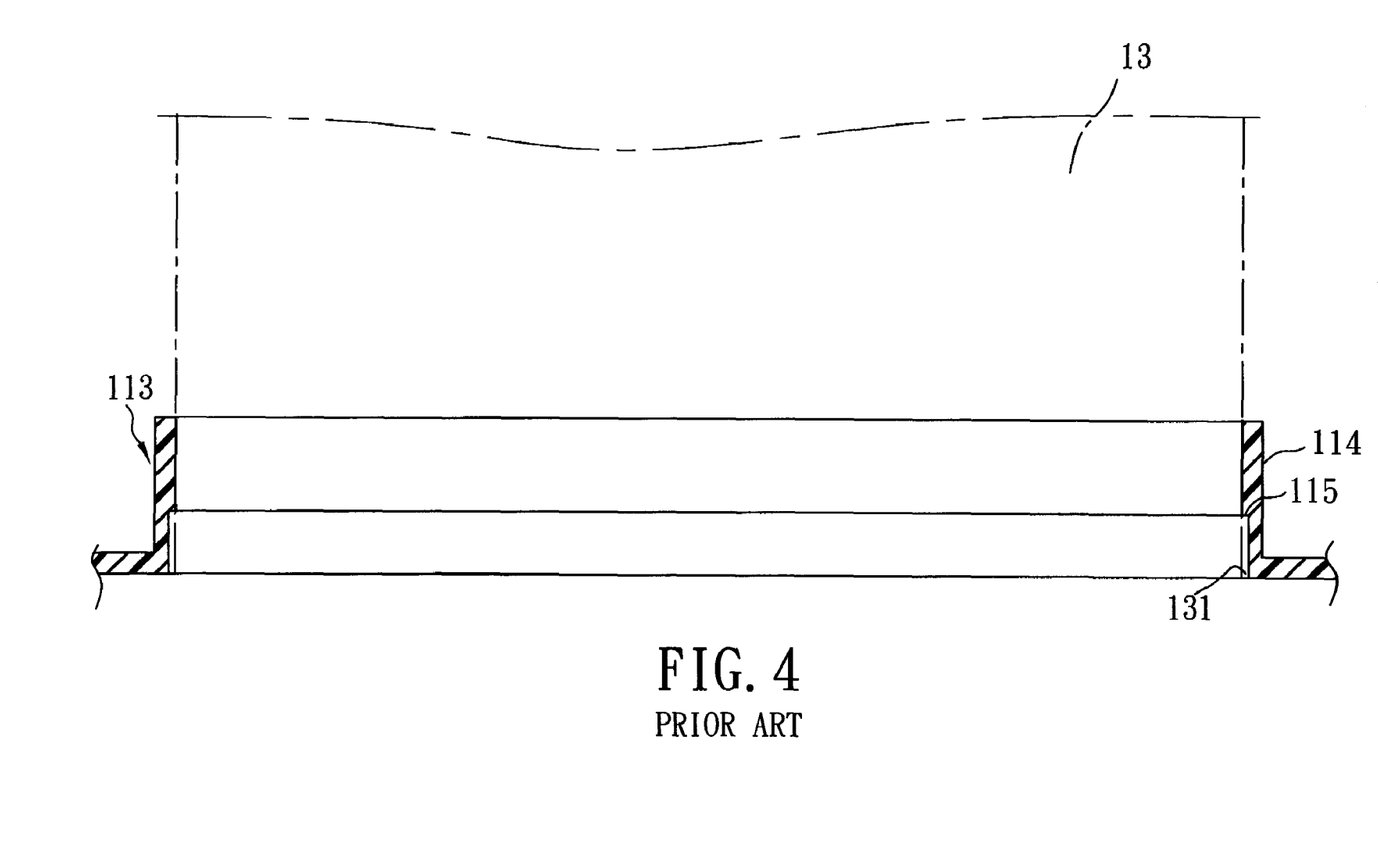
FIG. 4 is a sectional top view of the conventional computer housing with a box-like device installed therein.

As shown in FIGS. 1, 2 and 3, a conventional computer housing 1 includes a housing body 11 and a faceplate 12 mounted detachably on the housing body 11. The housing body 11 includes an upright front wall 111 formed with a front opening 112 for extension of a box-like device 13 (see FIG. 4) therethrough and into the housing body 11, and a frame 113 extending inwardly from a periphery of the front opening 112. The frame 113 includes a pair of lateral walls 114, each of which is formed with a neck 115.

The faceplate 12 serves to cover the front opening 112 of the housing body 11 when the box-like device, such as a data-storing device or a data read/write device, is not installed in the computer housing 1, and includes a plate body 121 and two pairs of engaging hooks 122, each of which extends from a respective end of the plate body 121, each of which has a hook end 124 for engaging a rear end of a respective one of the lateral walls 114 of the frame 113, and each of which is formed with a shoulder 125 that abuts against the neck 115 of the respective one of the lateral walls 114 when the faceplate 12 covers the front opening 112 of the front wall 111 of the housing body 11. Through engagement between the hook end 124 of each of the engaging hooks 122 and the rear end of the respective one of the lateral walls 114 and between the shoulder 125 of each of the engaging hooks 122 and the neck 115 of the respective one of the lateral walls 114, further movement of the faceplate 12 into or out of the frame 113 is prevented. However, formation of the neck 115 for preventing further movement of the faceplate 12 into the frame 113 results in a gap 131 (see FIG. 4) between the frame 113 and the box-like device 13 installed in the housing body 11, which is likely to accumulate dust thereat.

SUMMARY OF THE INVENTION

Therefore, the object of the present invention is to provide a computer housing that can overcome the aforesaid drawback associated with the prior art.

According to this invention, there is provided a computer housing that comprises: a housing body defining an accommodating space therein and having a front wall that is formed with a front opening for extension of a box-like device therethrough and into the accommodating space, the front wall being further formed with a mounting frame that protrudes from a periphery of the front opening into the accommodating space, that defines a frame space therein, and that has two opposite side walls, each of the side walls having a free end and being formed with a pair of engaging holes disposed between the free end and the periphery of the front opening, the free end of each of the side walls being formed with an engaging notch; and a faceplate mounted detachably on the mounting frame so as to cover the front opening. The faceplate has a middle plate portion that has two opposite ends, and two engaging units, each of which extends from a respective one of the opposite ends of the middle plate portion into the frame space and each of which includes a pair of first engaging arms and a second engaging arm disposed between the first engaging arms. Each of the first engaging arms of each of the engaging units has a first segment extending from the middle plate portion, and a second segment bent from the first segment and snapped into a respective one of the engaging holes in a respective one of the side walls of the mounting frame when the faceplate is mounted on the mounting frame. The second engaging arm of each of the engaging units has a hook end that is in snap engagement with the engaging notch in the free end of a respective one of the side walls of the mounting frame when the faceplate is mounted on the mounting frame.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 5:
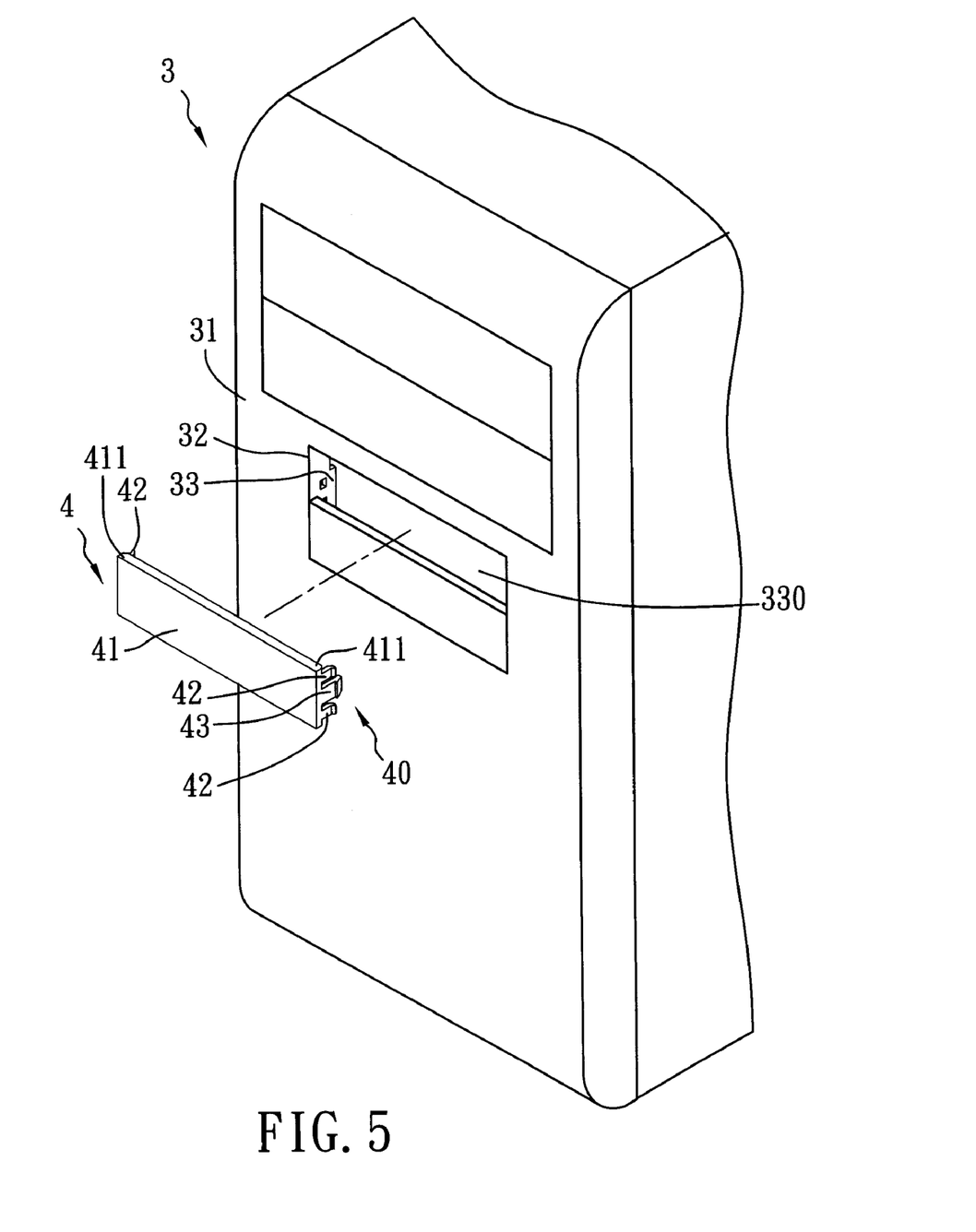
FIG. 5 is a fragmentary partly exploded perspective view of the preferred embodiment of a computer housing according to the present invention.
Figure 6:
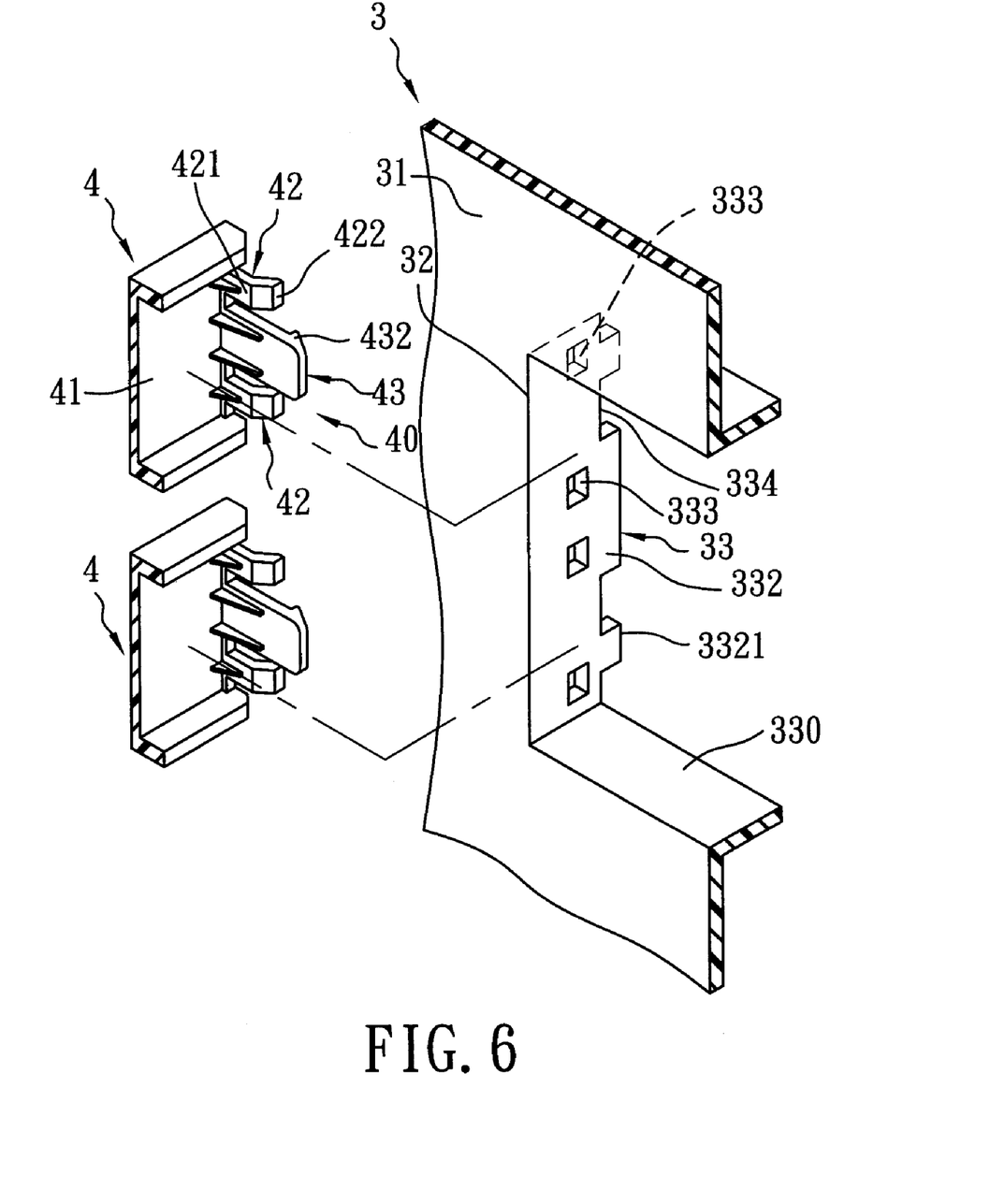
FIG. 6 is a fragmentary, partly sectional, perspective view of the preferred embodiment.
Figure 7:
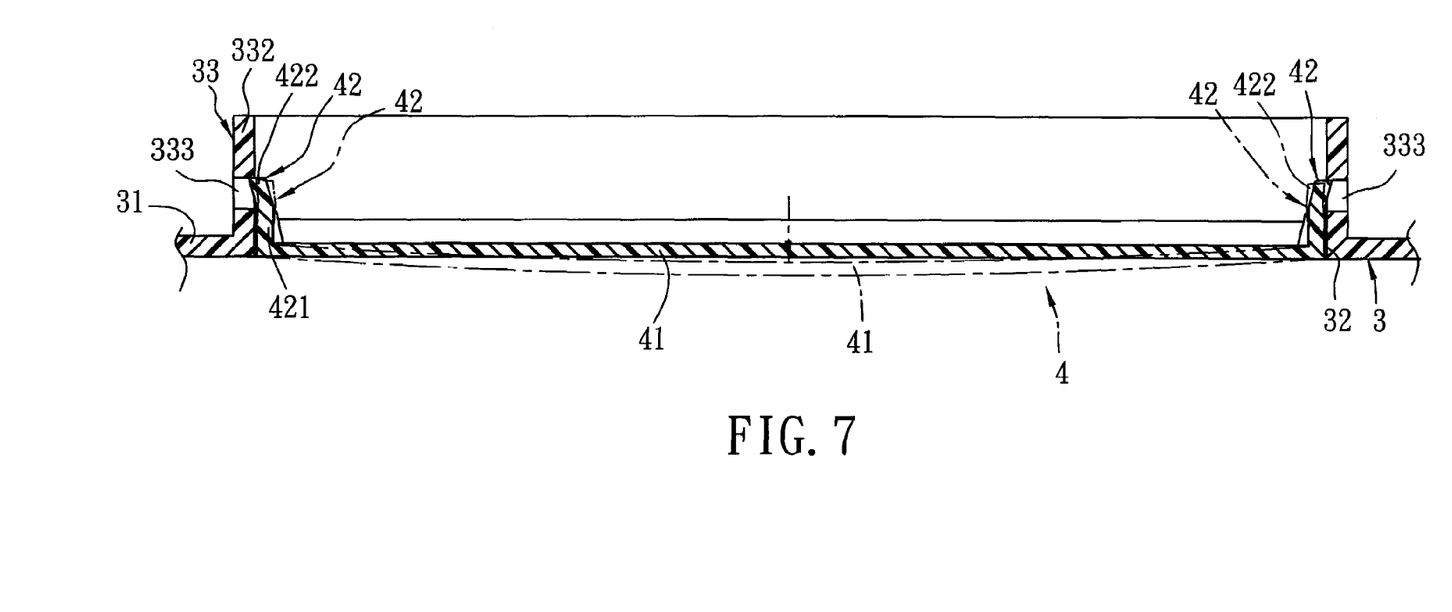
FIG. 7 is a sectional top view of the preferred embodiment.

Referring to FIGS. 5, 6 and 7, the preferred embodiment of a computer housing according to the present invention is shown to comprise: a housing body 3 defining an accommodating space therein and having a front wall 31 that is formed with a front opening 32 for extension of a box-like device 5 (see FIG. 8) therethrough and into the accommodating space, the front wall 31 being further formed with a mounting frame 33 that protrudes from a periphery of the front opening 32 into the accommodating space, that defines a frame space 330 therein, and that has two opposite side walls 332, each of the side walls 332 having a free end 3321 and being formed with a pair of engaging holes 333 disposed between the free end 3321 and the periphery of the front opening 32, the free end 3321 of each of the side walls 332 being formed with an engaging notch 334; and a faceplate 4 mounted detachably on the mounting frame 33 so as to cover the front opening 32. The faceplate 4 has a middle plate portion 41 that has two opposite ends 411, and two engaging units 40, each of which extends from a respective one of the opposite ends 411 of the middle plate portion 41 into the frame space 330 and each of which includes a pair of first engaging arms 42 and a second engaging arm 43 disposed between the first engaging arms 42. Each of the first engaging arms 42 of each of the engaging units 40 has a first segment 421 extending from the middle plate portion 41, and a second segment 422 bent from the first segment 421 and snapped into a respective one of the engaging holes 333 in a respective one of the side walls 332 of the mounting frame 33 when the faceplate 4 is mounted on the mounting frame 33. The second engaging arm 43 of each of the engaging units 40 has a hook end 432 that is in snap engagement with the engaging notch 334 in the free end 3321 of a respective one of the side walls 332 of the mounting frame 33 when the faceplate 4 is mounted on the mounting frame 33.

The side walls 332 of the mounting frame 33 define a frame width therebetween. The front opening 32 of the housing body 3 defines an opening width that is equal to the frame width of the mounting frame 33. Through engagement between each of the first engaging arms 42 and the respective engaging hole 333 in the respective side wall 332 and between the second engaging arm 43 of each of the engaging units 40 and the engaging notch 334 in the free end 3321 of the respective side wall 332, further movement of the faceplate 4 into and out of the frame space 330 is prevented.

Since the middle plate portion 41 of the faceplate 4 is slightly flexible, detachment of the faceplate 4 from the mounting frame 33 for installation of the box-like device 5 can be conducted by pushing the middle plate portion 41 (see FIG. 7) so as to slightly bend the middle plate portion 41 and so as to permit disengagement of the first engaging arms 42 from the engaging holes 333 and disengagement of the second engaging arms 43 from the engaging notches 334.

Figure 8:
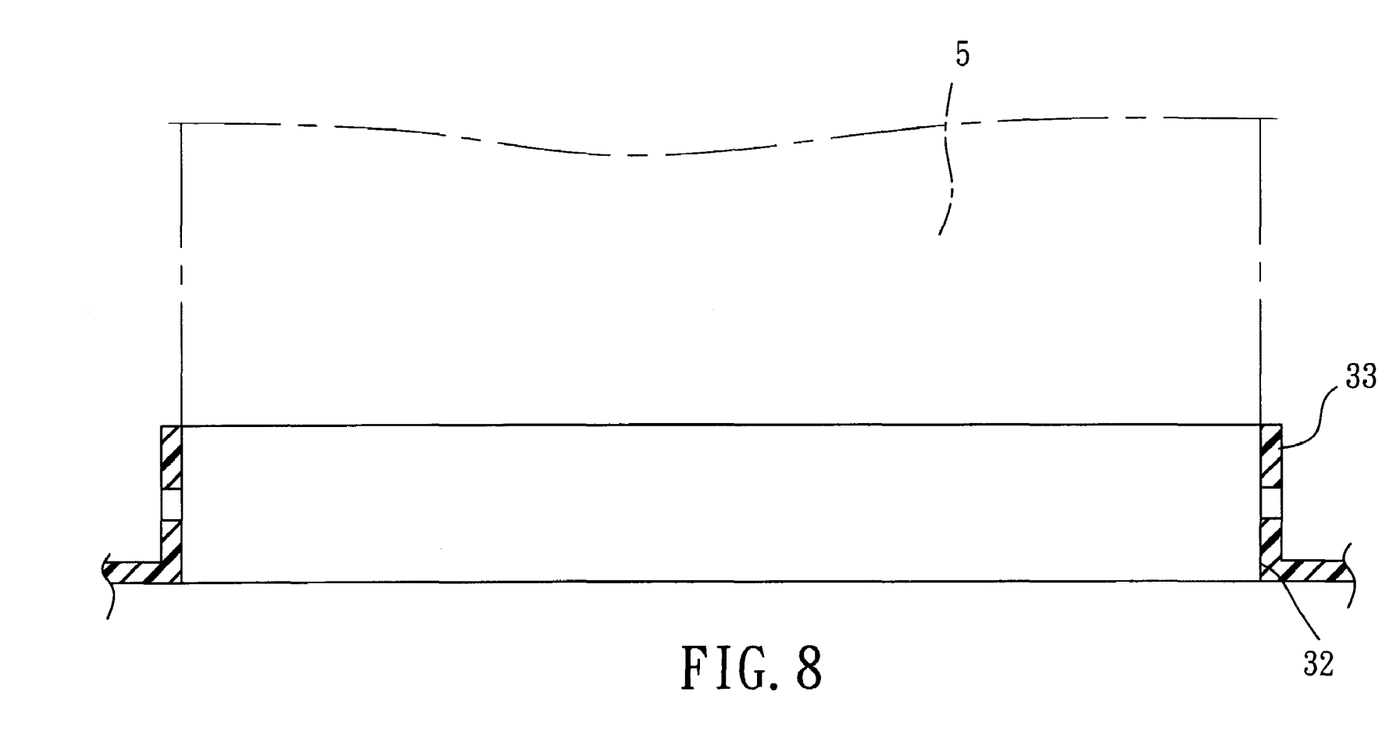
FIG. 8 is a sectional top view of the preferred embodiment with a box-like device installed therein.

With the inclusion of the first and second engaging arms 42, 43, the engaging holes 333 and the engaging notches 334 in the computer housing of this invention, the aforesaid neck and shoulder formed in the conventional computer housing can be dispensed with. Hence, the aforesaid gap resulting from the formation of the neck (see FIG. 4) can be eliminated in the computer housing of this invention, as best illustrated in FIG. 8, which permits the opening width of the front opening 32 to be equal to the frame width of the mounting frame 33.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A computer housing comprising:

a housing body defining an accommodating space therein and having a front wall that is formed with a front opening for extension of a box-like device therethrough and into said accommodating space, said front wall being further formed with a mounting frame that protrudes from a periphery of said front opening into said accommodating space, that defines a frame space therein, and that has two opposite side walls, each of said side walls having a free end and being formed with a pair of engaging holes disposed between said free end and said periphery of said front opening, said free end of each of said side walls being formed with an engaging notch; and a faceplate mounted detachably on said mounting frame so as to cover said front opening, said faceplate having a middle plate portion that has two opposite ends, and two engaging units, each of which extends from a respective one of said opposite ends of said middle plate portion into said frame space and each of which includes a pair of first engaging arms and a second engaging arm disposed between said first engaging arms, each of said first engaging arms of each of said engaging units having a first segment extending from said middle plate portion, and a second segment bent from said first segment and snapped into a respective one of said engaging holes in a respective one of said side walls of said mounting frame when said faceplate is mounted on said mounting frame, said second engaging arm of each of said engaging units having a hook end that is in snap engagement with said engaging notch in said free end of a respective one of said side walls of said mounting frame when said faceplate is mounted on said mounting frame.

2. The computer housing as claimed in claim 1, wherein said side walls of said mounting frame define a frame width therebetween, said front opening of said housing body defining an opening width that is equal to said frame width.

* * * * *